United States Patent
Radermacher et al.

(10) Patent No.: US 6,657,562 B2
(45) Date of Patent: Dec. 2, 2003

(54) DATA COMPRESSION/DECOMPRESSION METHOD AND APPARATUS

(75) Inventors: Ansgar Radermacher, Munich (DE); Klaus Juergen Schmitt, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/074,218

(22) Filed: Feb. 14, 2002

(65) Prior Publication Data

US 2002/0116424 A1 Aug. 22, 2002

(30) Foreign Application Priority Data

Feb. 14, 2001 (EP) .............................. 01103455

(51) Int. Cl.$^7$ .............................................. H03M 7/00
(52) U.S. Cl. ........................ 341/50; 711/100; 711/103
(58) Field of Search ................. 341/50, 51; 710/33, 710/4; 711/100, 103

(56) References Cited

U.S. PATENT DOCUMENTS

| | | | |
|---|---|---|---|
| 5,640,602 A | * 6/1997 | Takase | 710/35 |
| 5,652,857 A | * 7/1997 | Shimoi et al. | 711/113 |
| 5,726,489 A | * 3/1998 | Matsuda et al. | 257/659 |
| 5,943,692 A | * 8/1999 | Marberg et al. | 711/203 |
| 6,145,069 A | * 11/2000 | Dye | 711/170 |

OTHER PUBLICATIONS

Solomon, "Data Compression: The Complete Reference," New York, NY: Springer, US, pp 101–162, 357–360, ISBN: 0–387–98280–9, XP002150106.*

Ziv et al., "A Universal Algorithm for Sequential Data Compression," IEEE Transactions on Information Theory, vol. IT–23, No. 3, May 1977, pp. 337–343.*

Storer et al., "Data Compression via Textual Substitution," Journal of the Association for Computing Machinery, vol., 29, No. 4, Oct. 1982, pp. 928–951.*

* cited by examiner

*Primary Examiner*—Peguy JeanPierre
(74) *Attorney, Agent, or Firm*—Staas & Halsey LLP

(57) ABSTRACT

The present invention relates to a data compression techniques and is of particular relevance to embedded devices having a flash-prom. Data compression techniques have been known for many years. Devices such as mobile telecommunications handsets, personal digital assistants and vehicular navigation systems do not support access to data storage systems such as hard or floppy devices and their operating system and applications are typically stored on d flash-PROM that is associated with the embedded device. Flash-proms, suffer, in the main from being rather slow. Flash-proms are also expensive. The present invention seeks to provide a data compression/decompression arrangement which can reduce flash-PROM usage without increasing boot-up time and provides a method for processing information in a data processor operable to process data to provide a sequence of uncompressed and compressed data blocks, whereby each block comprises an even number of bytes. The invention can enable a reduction in boot-up time for systems.

14 Claims, 6 Drawing Sheets

```
while (!fin.eof()) {
    hdr1 = fin.read();        // read header byte from input stream if ((hdr1 & 0x80) != 0) {          // bit 7 = 1? => block type 2/3
        length = hdr1 & 0x3f;          // length stored in bits 0..5
        distance = fin.read();         // low byte distance
        if ((hdr1 & 0x40) != 0) {      // bit 6 = 1? => block type 3
            // block type 3 stores the distance information in two
            // bytes, an additional "high" byte has to be retrieved
            distance += 0x100 * fin.read();
        }
        // copy prior occurrence of the pattern – inner loop
        for (i=0; i<length; i++, out++) {
            memory[out] = memory[out-distance];
        }
    }
    else {                             // bit 7 = 0 => block type 1
        length = hdr1 & 0x7f;          // length stored in bits 0..6
        // fill memory from input stream – inner loop
        for (i=0; i<length; i++, out++) {
            memory[out] = fin.read();
        }
    }
}
```

FIGURE 4

DATA COMPRESSION/DECOMPRESSION METHOD AND APPARATUS

CROSS REFERENCE TO RELATED APPLICATIONS

This application is based on and hereby claims priority to European Application No. 011 03 455.0, the contents of which are hereby incorporated by reference.

BACKGROUND OF THE INVENTION

The present invention relates to a data compression method and apparatus and, in particular, but not restricted thereto, relates to a data compression/decompression method and apparatus for embedded devices having a flash-prom.

An increasing number of electronic devices are being provided with embedded devices. Devices such as mobile telecommunications handsets, personal digital assistants and vehicular navigation systems do not support access to data storage systems such as hard or floppy devices and their operating system and applications are typically stored on a flash-PROM that is associated with the embedded device. Flash-proms, also known as non volatile RAM, are typically small and have the ability to retain data, even when a power supply is disconnected. The memory is also instantly erasable in blocks.

Access to a flash-PROM is typically rather slow and a processor would operate at a corresponding rate if it operated by a fetching code directly from the flash-prom. Most boot-loaders, however, copy the code from the flash-PROM into a main memory, which could be for example, an SRAM, DRAM or SDRAM; by executing code from the main memory the processor can work at a much higher speed.

A reduction in the cost of hardware is preferred in all aspects of system design: a flash-PROM is more expensive than standard memories and, accordingly, flash-PROM capacity requirements should be minimized. In use it is preferred that data is compressed. Data compression is employed in several systems where boot-up time is not critical, for example during the start of a Linux kernel. The boot-up time is the period a system requires in order to become operational following switch-on, and a reduction in such time is typically sought for all devices which are regularly switched off. The overall boot-up time is dependent upon the time required to generate a reset, (which is hardware dependent), the time required to transfer a boot image into a memory and the boot-time of a kernel. One problem is that data compression increases boot-up time.

Data compression techniques have been known for many years. One widely known technique was developed by Ziv and Lempel in 1977 (LZ); a further technique by Storer and Szymanski (SS) provides an enhancement of the LZ technique. The basic principle of the LZ technique can be found in many compression utilities such as zip, gzip and arj. A sequence of symbols that occur in a data stream are referenced; subsequent occurrences of such symbol sequences (also denoted as patterns) are replaced by that reference, with the reference typically being shorter than the sequence itself. Presently there are many systems which combine the LZ/SS mechanisms with Huffman coding (Huffman coding enables the efficient storage of frequently used symbols). The combination of LZ/SS mechanisms with Huffman coding, whilst yielding good compression ratios is paid for by a higher runtime.

A still further constraint imposed in system operation is that of verification: a damaged flash-PROM might change a few symbols at random and a device operating with such a flash-PROM may appear to be fully operational but would not operate correctly.

As referred to above, the LZ & SS algorithms are known to provide fast compression and decompression of data. Nevertheless, these processes are not necessarily sufficiently fast for many applications, even with an optimized decompression mechanism written in, for example, assembly code. In order to improve the decompression time further, it has been found necessary to copy not only single bytes, but larger chunks of data at a time. A further complication can occur in the copying of large amounts of data in dword format, for example, since it is required that the source and destination addresses are aligned, i.e. start on an even address. This is not necessarily the case, since uncompressed and compressed blocks might have an odd length.

SUMMARY OF THE INVENTION

The present invention seeks to provide an improved data compression/decompression arrangement. The present invention further seeks to provide a data compression/decompression arrangement which reduces flash-PROM usage without increasing boot-up time.

In accordance with a first aspect of the invention, there is provided a method for processing information in a data processor operable to process data to provide a sequence of uncompressed and compressed data blocks, wherein each data block comprises a header part and a data part; wherein the method comprises the steps of:

checking each header part and data part of each processed block to determine whether each part contains an even number of bytes;

wherein, in the event that the number of bytes in any block part is odd, transferring a byte of information required by a subsequent block for each the block part or transferring a header byte of the current block to a previous block; and, storing the byte information and transferring the byte information to the subsequent or previous block as the subsequent or previous block is processed whereby each block comprises an even number of bytes.

In accordance with another aspect of the invention, there is provided a method for processing information in a data processor operable to process data to provide a sequence of uncompressed and compressed data blocks, the processor comprising a block selection mechanism that selects only blocks with an even distance and an even (data) length, wherein each data block comprises a header part and a data part; wherein the method comprises the steps of:

checking the header part of each processed block to determine whether it contains an even number of bytes;

wherein, in the event that the number of bytes in the header part is odd, transferring a byte of information required by a subsequent block to the current block or transferring a header byte of the current block to a previous block, whereby to ensure that the storage of all blocks have an even number of bytes.

In accordance with another aspect of the invention, there is provided a method of processing information in a data processor operable to provide uncompressed data from a sequence of uncompressed and compressed data blocks, each block having a distance byte and a header byte;

wherein if a block is uncompressed, the data that is following the block header will be copied to a destination pointer, whereby, each time a block of data is processed, the block length that is specified in the block header byte will be added to the destination pointer;

wherein, if a block is compressed, a distance indicator indicates the start location of a pattern which will be copied to the current destination pointer.

Preferably the sequence of a compressed and compressed data blocks are arranged in accordance with a Ziv-Lempel or similar algorithm. For each compressed block, there is a distance indicator associated with the block, which distance indicates the start location of a pattern which will be copied to a current destination pointer. The start location of the pattern can be calculated by the formula:

Pattern start address=current destination pointer−distance.

The length of the pattern can be specified by bits 0–5 of the header byte. The distance may range between 2 and $2^{17}-2$.

The method achieves high performance by employing block alignment: it copies a word and not a byte at a time. If applicable, it can make use of advanced features of the processor it runs on, e.g. data pre-fetching or a reordering of instructions in order to employ the parallel execution of different processor units.

In accordance with a further aspect of the invention, there is provided a data processor operable to process data to provide a sequence of uncompressed and compressed data blocks, wherein each data block comprises a header part and a data part;

wherein the data processor includes a filter operable to check that any header part or data part of a block is an even number of bytes and wherein the data processor is operable, in the event that the number of bytes in any block part being odd, to transfer a byte of information required by a subsequent block to a current block or to transfer a header byte of the current block to a previous block; and, wherein the processor is operable to store this byte of information, and to transfer this byte of information to the subsequent or previous block as the subsequent or previous block is processed, whereby the filter is operable to ensure that the data part of a block comprises an even number of bytes and that the header part of the block comprises an even number of bytes.

In accordance with a further aspect of the invention, there is provided a data processor operable to process data to provide a sequence of uncompressed and compressed data blocks, wherein each data block comprises a header part and a data part;

wherein the data processor includes a filter operable to select blocks with an even distance and an even (data) length and wherein the data processor is operable, in the event that the number of bytes in the header part of a block being odd, to transfer a byte of information required by a subsequent block to a current block or to transfer a header byte of the current block to a previous block, guaranteeing that the storage of all blocks along with additional or removed bytes of information (one or none applicable) requires an even number of bytes.

In accordance with a still further aspect of the invention, there is provided a data processor operable to provide uncompressed data from a sequence of uncompressed and compressed data blocks, each block having a distance byte and a header byte; wherein the data processor includes a filter operable to check whether a block of data is compressed or uncompressed;

wherein if a block is uncompressed, the data that is following the block header will be copied to a destination pointer, whereby, each time a block of data is processed, the block length that is specified in the block header byte will be added to the destination pointer; and wherein, if a block is compressed, a distance indicator indicates the start location of a pattern which will be copied to the current destination pointer.

The sequence of a compressed and compressed data blocks can be arranged in accordance with a Ziv-Lempel or similar algorithm.

The filter (the "compressor") can take care of there being an even number of data bytes within a block, and the reordering of header bytes of a block with an odd number of these bytes. The search of prior occurrences of a pattern is constrained by the capabilities of the filter: for example, only patterns with an even length and an even distance may be selected. In the event that the number of bytes in a header of a block is odd, a byte of information required by a subsequent block is transferred to the current block whereby the number of header bytes increases by one or a header byte of the current block which is already stored in a previous block whereby the number of header bytes decreases by one.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 4 shows a decompression algorithm usually employed by Lempel/Zip methods.

DETAILED DESCRIPTION OF THE PREFERRED EMBODIMENT

Figure 1:
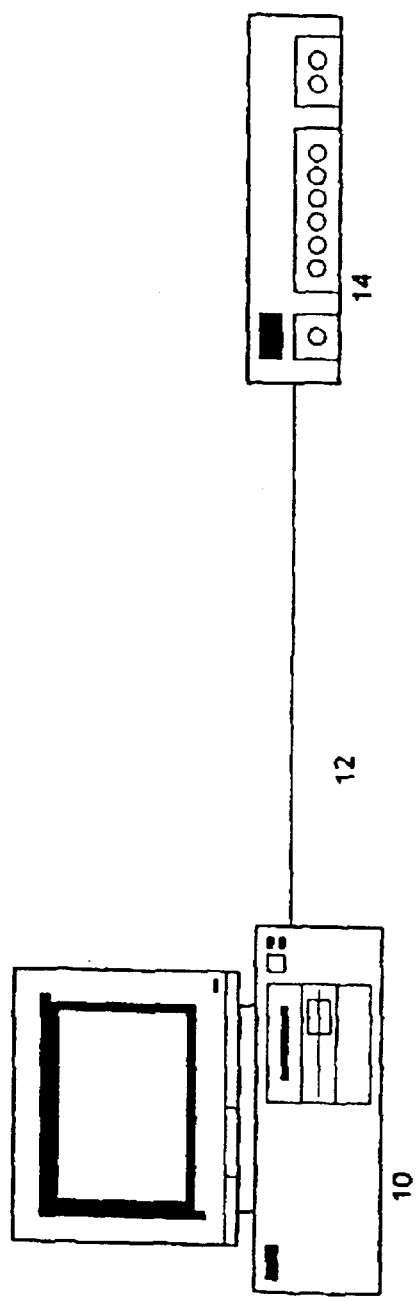
FIG. 1 shows a data transfer system.

Reference will now be made in detail to the preferred embodiments of the present invention, examples of which are illustrated in the accompanying drawings, wherein like reference numerals refer to like elements throughout.

It will be apparent, however, to one skilled in the art, that the present invention may be practiced without using these specific details. In other instances, well known methods and structures have not been described in detail so as not to unnecessarily obscure the present invention.

Referring now to FIG. 1, there is shown a data transfer scenario. A host computer 10 compresses data (deflation) and transmits compressed data, via a bus 12, which may be wired, optical or otherwise, to a target computer 14. The host computer compresses the file, calculates a checksum and stores the file in a hard-disk of the host computer. The target computer receives the compressed file (image) and stores the image in a flash memory. Each time the data is accessed and in the event that the data has not already been de-compressed, an associated processor invokes inflation or de-compression routines and inflates or de-compresses the data into the main memory of the target. The inflation routines also verify whether the checksum is correct or not.

Figure 2:
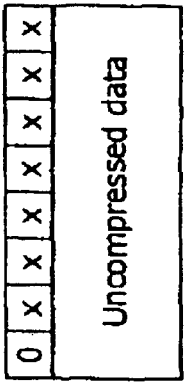
FIG. 2 shows the format of compressed and non-compressed blocks, usually employed by Lempel/Ziv methods.

As shown in FIG. 2, each block comprises a header part and a data part. The header bytes contain information about the type of block—whether it is compressed or uncompressed, the data length and, depending on the block type, the distance information. In the examples shown, the compression information is included in bit 7 of the byte, if bit 7 of the header byte is set, then the block is compressed: otherwise it is uncompressed. If the block is compressed, bits 0–5 contain the length of the pattern that should be copied from a former position of the output stream to the current position and bit 6 is used to indicate whether the compressed block requires one or two distance bytes. In the case of uncompressed blocks bits 0–6 contain the length of data following the protocol data.

In known methods, the contents of a block would normally be stored sequentially. However, since the number of header bytes can be odd, this would break the alignment of bytes within a block. Whilst this problem could be trivially solved by inserting a gap byte, this would result in a significant loss of the compression ratio (compression ratio would drop by more than 10%). The present invention provides an arrangement of header data within the input stream whereby to conform the data to alignment constraints by providing a header byte in the input stream that is needed by a subsequent block: the number of header bytes in a previous block would be increased by one and would become even whilst, in an analogous fashion, the number of header bytes in the subsequent block would be decreased by one. The information moved to the block being processed would be stored until needed by the subsequent block.

Figure 3:
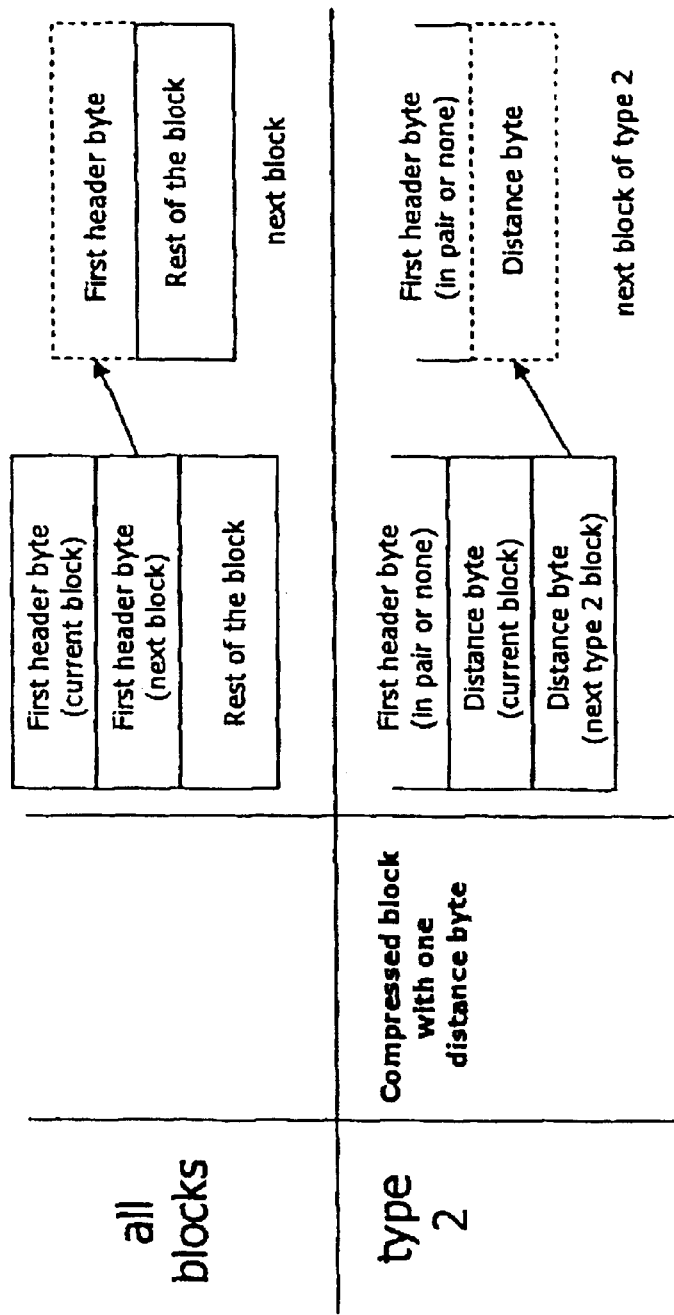
FIG. 3 shows examples of coded blocks arranged in accordance with the invention.

FIG. 3 show a sample strategy complying to the principle above: The first header byte of all blocks is always transferred as a pair containing the header byte of the current block and the header byte of the next one. This pair occurs only every second block (the dashed box denotes that the information is not actually stored at this position). Thus, the length of block type 1 and block type 3 is even. Similarly, the single distance byte of block type 2 is also transferred as a pair, containing the distance information for the current block and that for next block of type 2.

Thus the present invention provides a method whereby the data layout of compressed data is optimized for rapid decompression. Apart from compression methods that address single bits (e.g. prefix codes), the blocks in compressed files are not aligned to word or dword addresses. The present invention has been shown to provide an aligned data format that is optimized for very fast decompression alignment of data with a minimal diminution of the compression ratio. It will be appreciated that it is not possible to avoid diminution of compression ratio completely, since the alignment process imposes restrictions, such that the distance to an earlier occurrence is even and that the data has an even length. The problem of an odd number of header bytes is solved by moving information needed by a subsequent block into the current block.

FIG. 4 outlines the process of a typical decompression method and the process shall now be described in greater detail: A block of data, having a distance byte and a header byte, is either compressed or uncompressed. If a block is uncompressed, the data that is following the block header will be copied to the destination pointer, which is carried out in the second inner loop of FIG. 4. Each time a block of data is processed, the block length that is specified in the block header byte will be added to the destination pointer. The data can conveniently be provided in Java or C like pseudo code.

If the block is compressed, the "distance" indicates the start location of a pattern which will be copied to the current destination pointer. The start location of the pattern (pattern start address) can be calculated by the formula:

Pattern start address=current destination pointer−distance

The length of the pattern is specified by the bits 0–5 of the header byte. The distance would normally range between 1 and $2^{16}-1$ bytes. If it is known that the distance is even, the range could be extended to $2^{17}-2$ bytes since not the actual the distance, but the distance divided by two could be stored.

Figure 5:
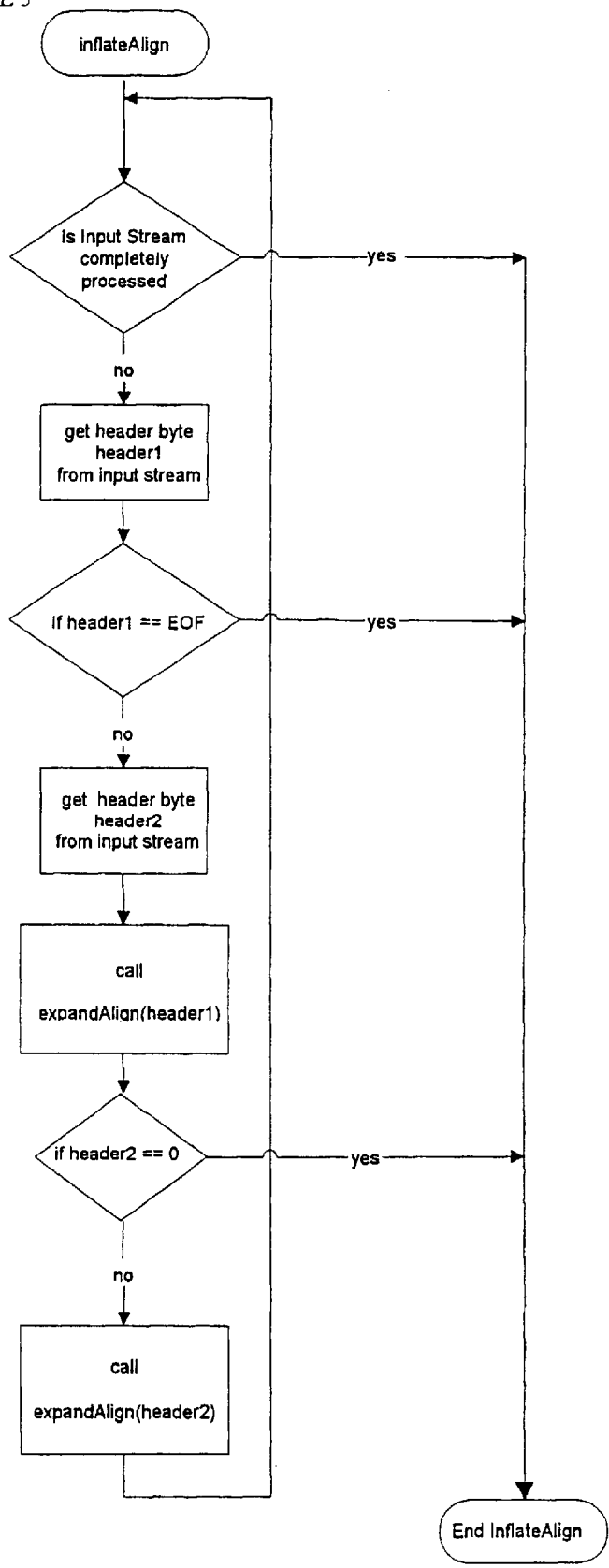
FIGS. 5 and 6 provide a flowchart for the steps involved in the inflation (decompression) process in accordance with the invention.
Figure 6:
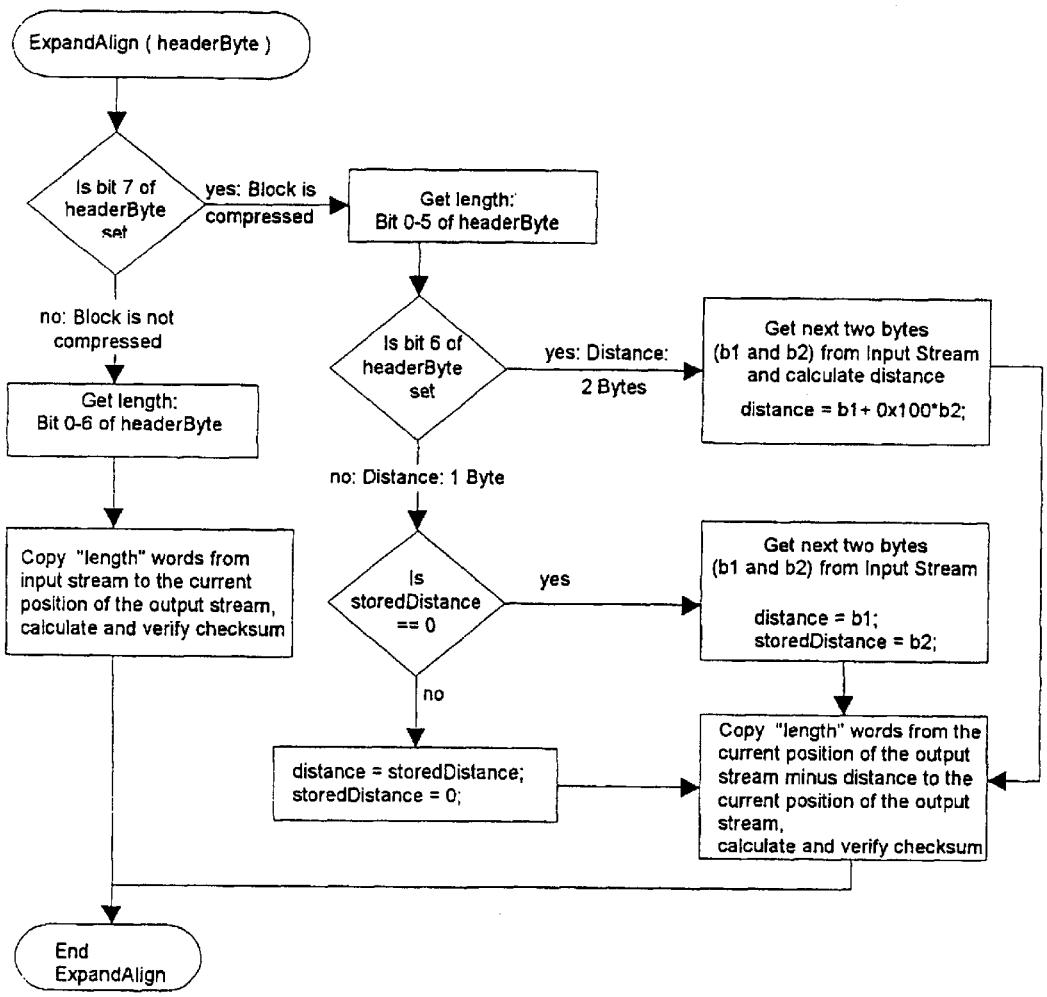

FIGS. 5 and 6 show a flowchart of the decompression algorithm in accordance with the invention. The outer loop is shown in FIG. 5. The loop body always processes two blocks at a time. At the beginning of the body, two header bytes are fetched from the input stream. These are the first header byte of the current and the first header byte of the next block. The decompression of a single block is shown in FIG. 6, carried out by the subroutine ExpandAlign. The passed header byte is analyzed and the processing is split according to the block type. In case of type 1 (uncompressed) and type 3 (compressed, distance stored in 2 bytes), the remainder of the block has an even number of bytes. In case of type 2 (compressed, distance stored in 1 byte) either none or two distance bytes are read from the input stream. One of these bytes is stored in the variable storedDistance, it is employed by the next block of type 2.

The invention was tested employing hardware comprising: a SH4 200 MHz processor having an 8-kByte instruction cache, a 16-kByte operand cache and a 64 MB memory. The instruction and operand cache operated in copy back mode with a code size of the inflation routine being 320 bytes. For the measurement a WinCE (RTM) kernel with a size of 10.384 kBytes was used. This file was compressed using different maximal differences as shown in table 1.

Table 1 shows a number of measurements, in which a WinCE kernel was compressed with different variants of the compression algorithm.

| Kernel | Size | Compression | Max Distance | Compression Rate | Copy/ Inflation Time |
| --- | --- | --- | --- | --- | --- |
| NK.bin | 10.384 kb | No | — | — | 760 ms |
| NK.bin.sz | 6.565 kb | Yes | 64 kByte | 36.8% | 959 ms |
| NK.bin.aligned.sz | 6.872 kb | Yes | 128 kByte | 33.3% | 678 ms |

The compressed kernel with the unaligned data structure achieves a good compression ratio, but does not meet our performance criterion. It is about 180 ms slower compared to a copying. The compression kernel with aligned data yields a very interesting result: its decompression is faster than simply copying from flash to memory. It had been estimated that the additional logic (compared to a copy routine) of a decompression algorithm would be compensated by the savings arising from the flash-PROM access: Nevertheless, the use of compression and decompression in accordance with the invention has been determined to be approximately 10% faster than copying.

Important features arising from the invention are: the code is compact enough to fit into an instruction cache of a processor; the operand cache enables minimal latency times to access data and to allow burst access to the SDRAM and flash-PROM—which allows efficient use of the flash-prom; code can be conveniently written in assembly code—which allows full control of the processor behavior to be obtained.

Further, all temporary variables are conveniently stored in registers—which allows for a reduction of access to main memory. Pre-fetch instructions are preferably employed to load cache lines in advance which avoids delays. Processor instructions can conveniently be grouped in a way that many instructions can be executed in parallel. Code alignment can therefore be easily optimized to achieve optimal runtime performance.

It will be realized that the speed gained depends on properties of the hardware, for instance the processor speed, and the usage scenario. The algorithm is not particularly effective, if the decompression speed is limited by a slow source media (e.g. a file obtained via a network or a CD-ROM), in these scenarios the higher compression ratio of computational intensive algorithms would yield better results. The method described here is particularly suitable, if the source medium is fast enough (i.e. the whole decompression time should not be dominated by the access of source data) whilst being considerably slower than the access time of the main memory (e.g. flash-prom, local hard-disk, high speed LAN). It will be appreciated that it is necessary to optimize for a specific processor. with particular reference to preferred The invention has been described in detail with particular reference to preferred embodiments thereof and examples, but it will be understood that variations and modifications can be effected within the spirit and scope of the invention.

What is claimed is:

1. A method for processing information in a data processor to provide a sequence of data blocks, each data block comprising a header part and a data part, the method comprising:
   checking the header part and data part of each data block to determine whether each part contains an even number of bytes;
   in the event that the data part has an odd number of bytes, transferring a data byte from a subsequent block to a current block, as a transferred byte;
   in the event that the header part has an odd number of bytes, transferring a header byte of the current block to a previous block; and
   storing any data or header bytes which are to be transferred, such that storing occurs prior to transferring and so that each block comprises an even number of bytes.

2. A method according to claim 1 wherein the data blocks are uncompressed and compressed in accordance with a Ziv-Lempel algorithm.

3. A method of processing information in a data processor to provide uncompressed data from a sequence of data blocks, each block containing data and having a distance byte and a header byte, the header byte specifying a block length, comprising:
   if the data block is uncompressed, copying the data that follows the header byte to a destination pointer;
   adding the block length that is specified in the header byte to the destination pointer each time the data block is processed; and
   if a data block is compressed, copying a pattern to the destination pointer, the distance byte indicating a start location of the pattern to be copied to the destination pointer.

4. A method according to claim 3 wherein the data blocks are uncompressed and compressed in accordance with a Ziv-Lempel algorithm.

5. A method according to claim 3 wherein the start location of the pattern is calculated by the formula:

Pattern start address=current destination pointer−distance of distance byte.

6. A method according to claim 5 wherein the distance ranges between 2 and $2^{17}-2$.

7. A method according to claim 3 wherein the block length of the pattern is specified by bits 0–5 of the header byte.

8. A data processor to provide a sequence of data blocks, each data block comprising a header part and a data part, comprising:
   a filter to check each block and determine whether any of the header part and the data part contain an even number of bytes;
   a transfer unit, operable in the event that the data part has an odd number of bytes, to transfer a data byte from a subsequent block to a current block or, in the event that the header part has an odd number of bytes, to transfer a header byte of the current block to a previous block; and
   a memory to store any data or header bytes which are to be transferred such that storing occurs before transferring,
   whereby the filter, transfer unit and memory ensure that each data part and each header part has an even number of bytes.

9. A data processor according to claim 8 wherein the data blocks are uncompressed and compressed in accordance with a Ziv-Lempel algorithm.

10. A data processor to provide uncompressed data from a sequence of data blocks, each data block containing data and having a distance byte and a header byte, the header byte specifying a block length, comprising:
    a filter to check whether a block of data is compressed or uncompressed;
    a first copy unit to copy, if the block is uncompressed, data that follows the header byte to a destination pointer, and
    an adder to add the block length that is specified in the header byte to the destination pointer each time the data block is processed; and
    a second copy unit to copy, if a block is compressed, a pattern to the destination pointer, the distance byte indicating a start location of the pattern to be copied to the destination pointer.

11. A data processor according to claim 10 wherein the data blocks are uncompressed and compressed in accordance with a Ziv-Lempel algorithm.

12. A data processor according to claim 10 wherein the start location of the pattern is calculated by the formula:

Pattern start address=current destination pointer−distance of distance byte.

13. A data processor according to claim 12 wherein the distance ranges between 2 and $2^{17}-2$.

14. A data processor according to claim 10 wherein the block length of the pattern is specified by bits 0–5 of the header byte.

* * * * *

UNITED STATES PATENT AND TRADEMARK OFFICE
CERTIFICATE OF CORRECTION

PATENT NO.    : 6,657,562 B2
DATED         : December 2, 2003
INVENTOR(S)   : Ansgar Radermacher et al.

It is certified that error appears in the above-identified patent and that said Letters Patent is hereby corrected as shown below:

<u>Title page,</u>
Item [57], ABSTRACT,
Line 8, after "on" change "d" to -- a --; and
Line 10, after "main" insert -- , --.

Signed and Sealed this

Twenty-fourth Day of February, 2004

JON W. DUDAS
*Acting Director of the United States Patent and Trademark Office*